(12) United States Patent
Bieck

(10) Patent No.: US 9,245,765 B2
(45) Date of Patent: Jan. 26, 2016

(54) APPARATUS AND METHOD OF APPLYING A FILM TO A SEMICONDUCTOR WAFER AND METHOD OF PROCESSING A SEMICONDUCTOR WAFER

(75) Inventor: Florian Bieck, Singapore (SG)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 413 days.

(21) Appl. No.: 13/394,812

(22) PCT Filed: Oct. 14, 2010

(86) PCT No.: PCT/SG2010/000395
§ 371 (c)(1),
(2), (4) Date: Mar. 8, 2012

(87) PCT Pub. No.: WO2011/046517
PCT Pub. Date: Apr. 21, 2011

(65) Prior Publication Data
US 2012/0168940 A1 Jul. 5, 2012

(30) Foreign Application Priority Data
Oct. 16, 2009 (SG) ................. 200906937-8

(51) Int. Cl.
*H01L 23/48* (2006.01)
*B32B 37/10* (2006.01)
*B32B 38/10* (2006.01)
*H01L 21/31* (2006.01)
(Continued)

(52) U.S. Cl.
CPC .......... *H01L 21/31* (2013.01); *H01L 21/67132* (2013.01); *H01L 21/76898* (2013.01); *H01L 23/481* (2013.01); *H01L 2224/02372* (2013.01); *H01L 2224/0401* (2013.01); *H01L 2224/05024* (2013.01); *H01L 2224/05025* (2013.01); *H01L 2224/11* (2013.01); *H01L 2224/13* (2013.01); *H01L 2924/1461* (2013.01); *Y10T 156/12* (2015.01)

(58) Field of Classification Search
CPC .................. H01L 21/31; H01L 23/481; H01L 2225/06541; H01L 2224/94
USPC .......... 257/618, 619, 621, 622, 623, 626, 737
See application file for complete search history.

(56) References Cited

U.S. PATENT DOCUMENTS

| | | |
|---|---|---|
| 3,873,319 A | 3/1975 | Berg |
| 4,289,841 A | 9/1981 | Cohen et al. |
| 4,341,859 A | 7/1982 | Keane et al. |

(Continued)

FOREIGN PATENT DOCUMENTS

| | | |
|---|---|---|
| EP | 0324596 A2 | 7/1989 |
| EP | 0324599 A2 | 7/1989 |

(Continued)

OTHER PUBLICATIONS

Bieck et al., WO 2009/141811, published Nov. 26, 2009.*

(Continued)

*Primary Examiner* — Peniel M Gumedzoe
(74) *Attorney, Agent, or Firm* — Ren-Sheng International

(57) ABSTRACT

Implementations and techniques for applying a film to a semiconductor wafer and for processing a semiconductor wafer are generally disclosed.

11 Claims, 14 Drawing Sheets

(51) Int. Cl.
*H01L 21/67* (2006.01)
*H01L 21/768* (2006.01)

(56) References Cited

U.S. PATENT DOCUMENTS

| | | | |
|---|---|---|---|
| 4,393,131 | A | 7/1983 | Whalin et al. |
| 4,478,932 | A | 10/1984 | Keane et al. |
| 4,504,607 | A | 3/1985 | Leech et al. |
| 5,106,450 | A | 4/1992 | Freisitzer et al. |
| 5,328,546 | A | 7/1994 | Brady et al. |
| 5,391,458 | A | 2/1995 | Conrad |
| 6,403,146 | B1 | 6/2002 | Larson et al. |
| 6,489,231 | B1 | 12/2002 | Kumar et al. |
| 6,623,912 | B1 | 9/2003 | Ching et al. |
| 6,754,551 | B1 | 6/2004 | Zohar et al. |
| 7,410,884 | B2 | 8/2008 | Ramanathan et al. |
| 7,625,821 | B2 | 12/2009 | Dolechek et al. |
| 7,741,003 | B2 | 6/2010 | Buchan et al. |
| 7,758,402 | B2 | 7/2010 | Yoshida et al. |
| 2005/0266335 | A1 | 12/2005 | Johnson et al. |
| 2006/0009026 | A1 | 1/2006 | Sawaguchi et al. |
| 2007/0045836 | A1 | 3/2007 | Kwon et al. |
| 2007/0243662 | A1 | 10/2007 | Johnson et al. |
| 2008/0017987 | A1 | 1/2008 | Fuchs et al. |
| 2008/0184555 | A1 | 8/2008 | Machida |
| 2009/0004859 | A1* | 1/2009 | Kimura et al. ............... 438/691 |
| 2009/0017623 | A1* | 1/2009 | Kajiyama et al. ............ 438/675 |
| 2010/0144118 | A1* | 6/2010 | Yang et al. ................... 438/459 |

FOREIGN PATENT DOCUMENTS

| | | |
|---|---|---|
| JP | S5784451 A | 5/1982 |
| JP | S58-175932 U | 11/1983 |
| JP | S59500636 A | 4/1984 |
| JP | S62-27148 A | 2/1987 |
| JP | H01289132 A | 11/1989 |
| JP | H05507585 A | 10/1993 |
| JP | 2003309221 A | 10/2003 |
| JP | 2006032695 A | 2/2006 |
| JP | 2006049804 A | 2/2006 |
| JP | 2008171980 A | 7/2008 |
| JP | 2008192999 A | 8/2008 |
| JP | 2009021462 A | 1/2009 |
| JP | 2009194064 A | 8/2009 |
| JP | 2010287648 A1 | 11/2010 |
| WO | 9211129 A1 | 7/1992 |
| WO | 03028090 A2 | 4/2003 |
| WO | 2009141811 A2 | 11/2009 |

OTHER PUBLICATIONS

Notification of Transmittal of the International Search Report and the Written Opinion of the International Searching Authority, Dec. 15, 2010.
Thomas Goodman et al., "Evaluating Wafer-Level Solder Reflow Options to Maximize Yield", http://www.chipscalereview.com, Aug. 2003 issue.
George A. Riley et al., "Tutorial 11: Under Bump Metallization (UBM)", FlipChips Dot Com, Sep. 2011.
http://en.wikipedia.org/wiki/Diffusion_barrier.
http://en.wikipedia.org/wiki/Etching_(microfabrication).
Ken Gilleo et al., "Tutorial 6: A Brief History of Flipped Chips", FlipChips Dot Com, Mar. 2001.
Neil Gorman et al., "Step by Step—Step 4: Printing", SMT Magazine, Apr. 2006, pp. 41.
Shubo Gao, "New Technologies for Lead-Free Flip Chip Assembly", University of London, 2005, Department of Electrical and Electronic Engineering, Imperial College London, United Kingdom.
Stefan Pargfrieder et al., "Temporary Bonding and DeBonding Enabling TSV Formation and 3D Integration for Ultra-thin Wafers", Proc 10th Electronic Packaging and Technology Conf, Dec. 2008, pp. 1301-1305, Singapore.
A. Jouve et al., "Facilitating Ultrathin Wafer Handling for TSV Processing", Proc 10th Electronic Packaging and Technology Conf, Dec. 2008, pp. 45-50, Singapore.
J. Charbonnier et al., "Integration of a Temporary Carrier in a TSV Process Flow", Proc 59th Electronic Packaging and Technology Conf, May 2009, pp. 865-871, Las Vegas.
M. S. Huang et al., "Temporary Bonding of Wafer to Carrier for 3D-Wafer Level Packaging", Proc 10th Electronic Packaging and Technology Conf, Dec. 2008, pp. 405-411, Singapore.
Rob Llic, "Optical Lithography", Mirkin group, national nanotechnology Infrastructure Network, Sep. 2010, pp. 139 Also available at <URL: http://www.nnin.org/sites/default/files/files/iWSG_2010/Day2_0900_llic_BothTalks_Presentation.pdf>.
"Polyimide", Wikipedia, Retrieved from the Internet at <URL: https://en.wikipedia.org/wiki/Polyimide> on Jun. 25, 2015, Last modified on Jun. 22, 2015.

* cited by examiner

APPARATUS AND METHOD OF APPLYING A FILM TO A SEMICONDUCTOR WAFER AND METHOD OF PROCESSING A SEMICONDUCTOR WAFER

CROSS REFERENCE TO RELATED APPLICATIONS

The present application is a U.S. National Stage filing under 35 U.S.C. §371 of International Application No. PCT/SG2010/000395, filed on Oct. 14, 2010 and entitled "APPARATUS AND METHOD OF APPLYING A FILM TO A SEMICONDUCTOR WAFER AND METHOD OF PROCESSING A SEMICONDUCTOR WAFER." The International Application claims priority under 35 U.S.C. §119(a) to Singapore Patent Application No. SG200906937-8 filed on Oct. 16, 2009, entitled "APPARATUS AND METHOD OF APPLYING A FILM TO A SEMICONDUCTOR WAFER AND METHOD OF PROCESSING A SEMICONDUCTOR WAFER." The disclosure of the foregoing applications is hereby incorporated by reference in their entireties, including any appendices or attachments thereof, for all purposes.

BACKGROUND

Photo-resist is often used in semiconductor manufacturing in order to fabricate structured layers such as redistribution layers on a semiconductor wafer. The photo-resist may be applied to the semiconductor wafer in a liquid form known as a wet resist. The wafer then may be spun so that the layer of photo-resist on the surface of the wafer has a uniform thickness. Alternatively, the photo-resist may be applied to the semiconductor wafer in a dry form known as dry film resist. The dry film resist is often provided in the form of a film, which may be delivered on a roll. Typically, the dry film resist is supplied in a form of a laminated film with a film of photo-resist sandwiched between a cover film and a carrier film. The dry film resist may be applied to a substrate, such as a printed circuit board, or to a wafer by lamination techniques.

The wet resist may be associated with some peculiarities in some circumstances. For example, if a thick layer of resist, such as more than fifty micrometers, is desired as a template for electrochemical deposition of alloys that may later serve as a bumps in a wafer bumping process. The wet resist having a low viscosity can be used to produce the thick layer. However, the uniformity of the thickness of the layer produced in this way can vary to a degree. In contrast, the dry film resist can be produced in relatively large thicknesses of fifty um or more with a very high accuracy.

Another aspect of the wet resist occurs for coating a wafer surface that has certain topography, such as cavities that are found often in micro-electromechanical system (MEMS) applications. With the wet resist, it may not be possible to achieve a homogenous coverage of the surface due to surface tension at sharp corners of the topography. However, the dry films have a certain internal stiffness, which may allow them to cover evenly such topography.

U.S. Pat. No. 6,623,912 discusses a method in which the dry film resist is unwound from a storage roll to a take-up roll. Two rollers and a heat and pressure roller are positioned so that the film contacts a semiconductor wafer over a heat stage. After the dry resist film is laminated on the wafer by applying the heat and pressure roller, a cutting laser is used to separate the portion of dry resist film now attached to the wafer from the bulk of the dry resist dry film resist on the roll.

SUMMARY

This disclosure is drawn, inter alia, to methods, apparatus, and systems related to applying a film to a semiconductor wafer and to processing of a semiconductor wafer.

Some examples of the present disclosure describe a semiconductor wafer. Some example semiconductor wafers may include a supporting peripheral rim and a dry film resist. The supporting peripheral rim may protrude from a rear side of the semiconductor wafer. The dry film resist may be arranged on the rear side of the semiconductor wafer within the supporting peripheral rim.

Some examples of the present disclosure describe a system for applying a film to a semiconductor wafer. Some example systems for applying a film to a semiconductor wafer may include a cutting device, a vacuum chuck, and a pressing tool. The cutting device may be adapted to cut a piece out of a film. The vacuum chuck may be adapted to remove the piece from the film, where the chuck may be adapted to move in a direction perpendicular to a major surface of the film and in at least one direction parallel to the major surface of the film. The pressing tool may be adapted to press the piece onto the semiconductor, where the semiconductor wafer may include a supporting peripheral rim that protrudes from a rear side of the semiconductor wafer.

Some examples of the present disclosure describe methods related to applying a film to a semiconductor wafer. Some example method may include providing a semiconductor wafer. A laminated film may be provided. The laminated film may include a dry film resist and a carrier film that may be provided next to the dry film resist. At least one piece may be cut out of the laminated film having a size and shape adapted to the semiconductor wafer. The piece may be applied to the semiconductor wafer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

Figure 1:
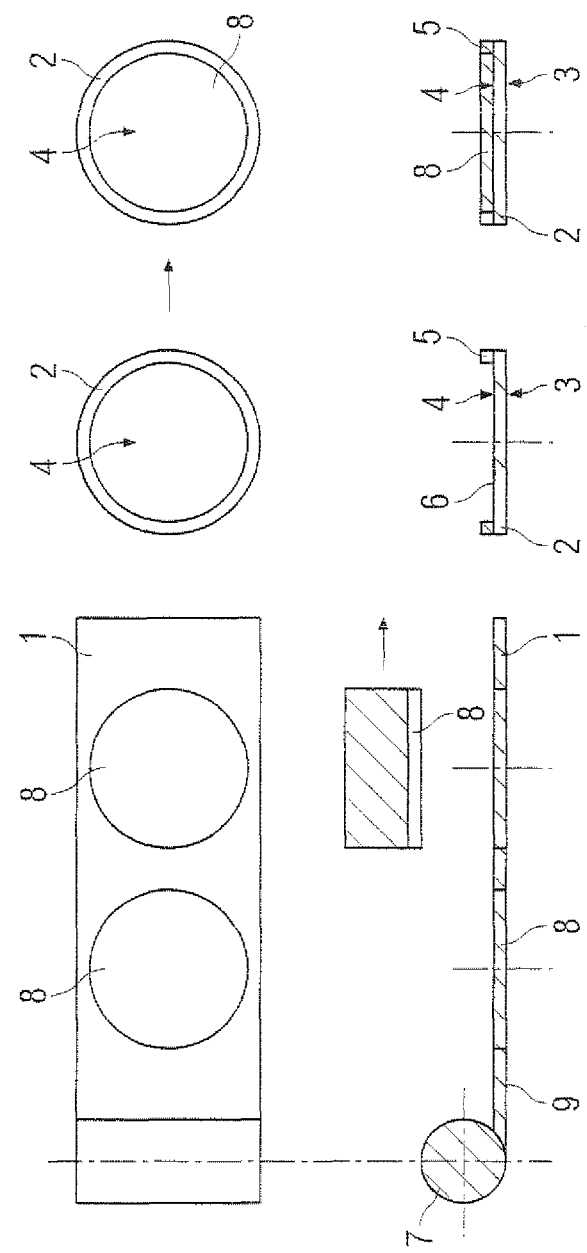
FIG. 1 illustrates a top view and a side view of a method of applying a film to a semiconductor wafer according to a first embodiment.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, and systems related to applying a film to a semiconductor wafer and method of processing a semiconductor wafer.

The present application relates to apparatus and a method of applying a film to a semiconductor wafer, in particular applying a dry film resist to a semiconductor wafer, and to processing a semiconductor wafer.

The present application provides a method of applying a film to a semiconductor wafer that may include providing a semiconductor wafer and providing a laminated film including a dry film resist and a carrier film that may be provided next to the dry film resist. At least one piece may be cut out of the laminated film that has a size and shape adapted to the semiconductor wafer. The piece may then be applied to the semiconductor wafer.

In this method, the laminated film may be first worked to produce a piece of the laminated film having a desired size and shape and, subsequently, this piece may be applied to the semiconductor wafer. The piece cut out from the laminated film may have the size and shape corresponding to that of the semiconductor wafer. In this method, the laminated film once applied to the semiconductor wafer may not protrude over the edges of the semiconductor wafer, as may be the case in a method in which the film is laminated onto the wafer whilst being attached to the supply roll. This may simplify further handling of the semiconductor wafer.

Furthermore, the dry film resist may be applied to only portions of the semiconductor wafer using this method. For example, for a semiconductor wafer having a supporting peripheral rim structure, which protrudes from a side of the wafer and confines a central recessed region, the dry film resist can be placed into the central recessed region and the peripheral rim can remain free of the dry film resist.

The piece may be cut out of the laminated film using any suitable cutting technique. In one embodiment, the pieces may be cut out of the laminated film by stamping.

The size and shape of the piece may be adapted to the semiconductor wafer. If the semiconductor wafer is circular, the piece may also be circular and may have a diameter corresponding to the diameter of the wafer.

In an embodiment, the piece may be removed from the laminated film by use of the vacuum chuck. A vacuum chuck may operate so that the piece can be detachedly attached to be vacuum chuck without the use of additional adhesives, which may cause contamination of the upper surface of the piece.

The laminated film may be positioned so that the carrier film faces upwardly and contacts the vacuum chuck. The dry film resist can be arranged between a cover film and the carrier film in this embodiment. In this embodiment, the cover film may be removed from the piece of the laminated film after the piece has been removed from the laminated film and before the piece is applied to the semiconductor wafer. The dry film resist may be exposed once the cover film is removed. Alternatively, the cover film may be removed from the laminated film before the piece is cut out from the laminated film.

The piece may be applied to the semiconductor by pressing it onto the surface of the semiconductor wafer by, for example, a pressing tool having a pressing surface adapted to the size and shape of the piece. Heat may also be applied whilst the piece is pressed onto the semiconductor wafer so as to adhere the piece onto the semiconductor wafer. Generally, the cover film may be removed from the laminated film before the piece is pressed onto the semiconductor wafer. Therefore, the dry film resist may be exposed on one side and the dry film resist may be pressed onto the semiconductor wafer. The carrier film may remain on the opposing side of the dry film resist layer and may attach to the semiconductor wafer.

As discussed above, the semiconductor wafer may have a supporting peripheral rim, which may protrude from the first side of the wafer. This first side may be the rear side of the wafer. The piece may be positioned on the rear side of the semiconductor wafer within the supporting peripheral rim. Therefore, the piece may be positioned in the recess defined by the supporting peripheral rim on the rear side of the wafer. In this embodiment, the piece may have a size and shape adapted to the size and shape of the area confined by the peripheral rim. The peripheral rim may be continuous but may also include a plurality of perforations, which extend from an inner wall to an outer wall of the supporting peripheral rim.

The semiconductor wafer may be further processed after the film has been applied to the semiconductor wafer. The application may also provide a method of manufacturing a semiconductor wafer. In this embodiment, the dry film resist may be a polyimide and may subsequently form a part of the redistribution structure of the wafer. The carrier film can be removed and the dry resist film can be used as an electrically insulating layer of a redistribution structure. A structured electrically conductive layer can be deposited on the top of the dry film resist to provide the redistribution layer.

In cases where the semiconductor wafer includes vias, the dry resist film can be structured to uncover the ends of the vias so that the subsequently deposited electrically conductive traces can be electrically connected to the opposing side of semiconductor wafer by way of the vias.

The dry film resist can also be used as a temporary resist layer. In a further method, the dry film resist may be photo-structured to expose portions of the semiconductor wafer, which may then be structured, for example by etching. After the semiconductor wafer has been structured, the remaining structured dry film resist may then be removed.

The dry film can be obtained from a supplier, such as DuPont, that provides a variety of application specific dry film products in various thicknesses, for example. The products can include several product series. A first product series may be used for via creation, via fill, micro-bump creation, and redistribution layer (RDL) structuring. A second product series can be designed for bumping or pillar creation whilst a third product series can act as a permanent dry film for bonding, cavity packages, micro fluidics, dielectric, and fan out.

Photo-structuring techniques may be used to photo-structure the dry-film resist. The photo structuring may permit formation of structures, such as conductive tracks, metal traces, or a redistribution layer, using the photo-resist. In one embodiment, a mask is applied to the carrier film. The carrier film as well as the dry resist film then may be exposed to UV (ultra-violet) radiation. The carrier film then may be removed and the dry film resist may be developed to remove unexposed portions of the dry film resist. Regions of the semiconductor wafer, which are uncovered by the dry film resist, may then be structured.

In a generic sense, the carrier film can be removed before or after the exposure. Usually, the carrier film may be removed after the exposure, as the carrier film protects mechanically the resist. The resist also hardens after the exposure and thus reduces adhesion to the carrier film. This permits an easy removal of the carrier film.

In addition, after the exposure, the same pressing tool can be used for the removal of the carrier film. Because of the reduced adhesion, a vacuum device in the pressing tool can remove the carrier film in the same way the stamped dry film portions are removed.

In one embodiment of a tool to remove the carrier film from the wafer, the removal tool may include a suction device that touches only an outer edge of the carrier film. The removal tool may either integrate into the pressing tool or exist as a separate tool. A method for removing the carrier film may include the removal tool touching and adhering to the outer edge of the carrier film by way of a vacuum device. The removal tool later may move slowly upwards by circa ten mm (millimeters) to separate the outer edge from the wafer, for example. The removal tool then may move sideway and may peel off the carrier film. In this manner, only shear force may be applied onto the wafer. The removal process may be smooth and little to no damage may be done to the resist.

A similar above tool can be applied for removing the cover film.

The application also provides a semiconductor wafer having a supporting peripheral rim protruding from a rear side of the wafer and a dry film resist arranged on the rear side of the wafer within the supporting peripheral rim. The supporting peripheral rim may remain free of the dry film resist. The dry film resist may have cut edges rising because of the cutting process to cut a piece of the dry film resist from a supply film. The cut edges may be frayed. The dry film resist can form an integral part of the semiconductor wafer or of a semiconductor chip. This dry film resist may include a polyimide. A redistribution layer may be positioned on the dry film resist. Alternatively, a solder bump may also be positioned on the dry film resist such that the solder bump is also positioned over a via. The supporting peripheral rim may have the form of a ring and may include a plurality of perforations.

The application also provides a system for applying a film to a semiconductor wafer. The semiconductor wafer may include a supporting peripheral rim that protrudes from a rear side of the semiconductor wafer. The system may include a cutting device for cutting pieces out of the film, a vacuum chuck adapted to remove the pieces cut out from the film, and a pressing tool adapted to press the piece onto a semiconductor wafer. The vacuum chuck may be movable in directions perpendicular to a major surface of the film and in at least one direction parallel to the major surface of the film. In cases where the major surface of the film is described as lying in the x-y plane, the vacuum chuck may be movable in the z direction and in at least one of the x and y directions.

The system may also further include a film support chuck for supporting a major surface of the film whilst the cutting device cuts pieces out of the film. The cutting device may be a stamping tool.

In an embodiment, the vacuum chuck may include a generally flat surface having an areal extent adapted to the areal extent of the pieces cut out of the film. This may permit the film to be removed and held on the vacuum chuck whilst keeping the film planar. This may help to avoid deformation and possibly tearing of the film during its removal from the film and is transferred to the semiconductor wafer.

The vacuum chuck may include a plurality of through holes distributed over the area of the flat surface, which may be coupled to a vacuum device. The film can be detachably attached and released from the flat surface by applying and removing the vacuum reliably due to the distribution of the through holes and suction points provided by the through holes when attached to the vacuum across the entire flat surface.

In an embodiment, the pressing tool may include a generally flat surface having an areal extent adapted to the areal extent of the pieces cut out of the film. This may permit the pressing tool to make contact with the entire piece during pressing; thus, providing a uniform pressure and enabling the film to be reliably attached to the wafer.

The system may also include heating device configured to apply heat to the film whilst the pressing tool presses the film onto the wafer. The heating device may be separate from the pressing tool or may be provided as a heating element within the pressing tool, which may permit the pressing surface of the pressing tool to reach an increased temperature. The combination of heat and of pressure helps the film adheres to the wafer.

The system may also include a wafer chuck having a support surface for supporting the wafer. The wafer may also be held on to the wafer chuck by the use of a vacuum and the surface of the wafer chuck may include a plurality of through holes are coupled to a vacuum device.

The system may be used as follows to attach a dry film resist to the rear side of a semiconductor wafer having a supporting peripheral rim protruding from the rear side of the wafer and defining a central circular recess.

A supply of laminated film including a dry film resist sandwich between a cover film and a carrier film may be provided on the film support chuck. The cover film may be positioned on the film support chuck and the carrier film may face away from the film support chuck. The stamping device may be used to stamp out a circular piece of laminated film having a diameter corresponding to the diameter of the central recess positioned on the rear side of the semiconductor wafer.

The vacuum chuck and the pressing tool each may have a flat surface, which may be circular and may have a diameter that also corresponds to the diameter of the central recess position on the rear side of the wafer. The vacuum chuck may be aligned with the circular piece of laminated film cut out of the laminated film supply and may be lowered onto the circular piece. The vacuum may be switched on so that the circular piece of laminated film becomes detachably attached to the flat surface of the vacuum chuck and the vacuum chuck may be moved upwards away from the major film surface of the laminated film to remove the circular piece from the laminated film supplied. The vacuum chuck then may be moved in the direction of the semiconductor wafer. The cover film then may be removed from the piece held on the vacuum chuck to expose a surface of the dry film resist.

The vacuum chuck then may be aligned with the circular recess in the rear side of the wafer and may be lowered until the lower surface of the dry film resist is in contact with the rear side of the semiconductor wafer and, in particular, the rear side of the semiconductor wafer within the central recess. The vacuum to the vacuum chuck then may be switched off so that the film is released from the vacuum chuck.

The vacuum chuck then may be removed and the pressing tool may be aligned with the circular piece and circular central recess of the rear side of the semiconductor wafer. The pressing tool then may be brought into contact with the circular piece and may press it into the onto the rear side of the semiconductor wafer whilst applying heat to adhere the dry resist film and carrier film to the rear side of the semiconductor wafer. The pressing tool then may be removed. The semiconductor wafer now may include a circular dry film resist positioned only in the central recess.

FIGS. 1 to 28 may have similar parts. The similar parts have the same names or the same part numbers. The description of the similar parts is hereby incorporated by reference, where appropriate.

FIG. 1 illustrates a schematic top view and side view of a method of applying a film 1 to a semiconductor wafer 2 in accordance with at least some embodiments of the present disclosure.

The semiconductor wafer 2 may have a front side 3 and a rear side 4 from which a supporting peripheral rim 5 protrudes. The supporting peripheral rim 5 may be integral with the material of a semiconductor wafer 2. The wafer 2 and the supporting peripheral rim 5 may be circular. The supporting peripheral rim 5 may have the form of a ring, which may confine a central recessed portion 6, which also may be circular in plan view.

Figure 28:
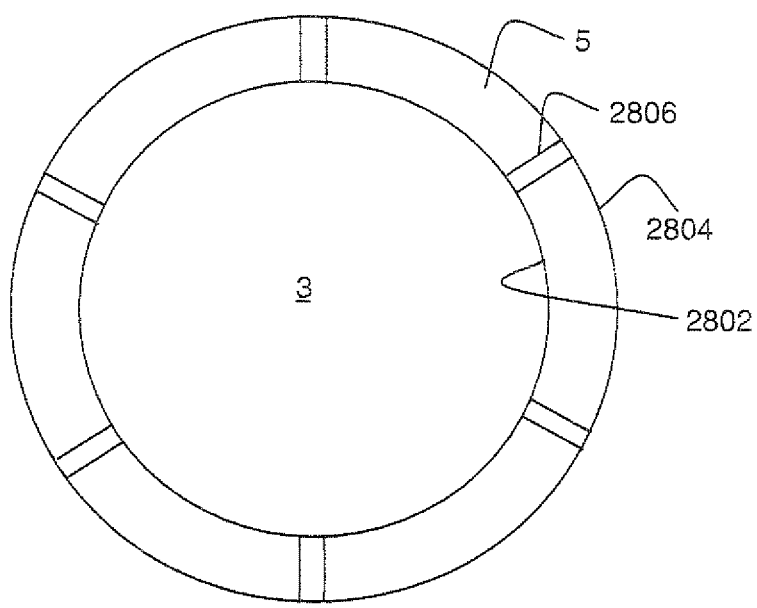
FIG. 28 illustrates a top view of a semiconductor wafer, all of which are arranged in accordance with at least some embodiments of the present disclosure.

In the illustrated embodiment, the supporting peripheral rim 5 may be continuous and solid. FIG. 28 illustrates a top view of a semiconductor wafer 2 arranged in accordance with at least some embodiments of the present disclosure. As illustrated in FIG. 28, in some embodiments, a plurality of perforations 2806 or slits may be provided in the peripheral rim 5. Such perforations 2806 may extend radially from an inner wall 2802 to an outer wall 2804 through the thickness of the peripheral rim 5. FIG. 28 has not been drawn to scale, and may include many more, or fewer perforations 2806 distributed evenly or unevenly through peripheral rim 5.

Referring back to FIG. 1, a supply roll 7 of the film 1 to be applied to the semiconductor wafer 2 may be provided and a portion may be drawn from the supply roll 7. A piece 8 may be cut out of the film 1 and then may be removed from the film 1. In this embodiment, the piece 8 cut out of the film 1 may be circular and may have a diameter, which corresponds to the diameter of the central recessed portion 6 in the rear side 4 of the semiconductor wafer 2. The piece 8 can be cut out of the film 1 by a stamping tool. The piece 8 may be removed from the supply film 1. This may leave a circular hole in the supply film 1. The piece 8 then may be transferred to the rear side 4 of the semiconductor wafer 2. In particular, the piece 8 may be placed in the central recessed portion 6 of the rear side 4 of the semiconductor wafer 2.

Figure 2:
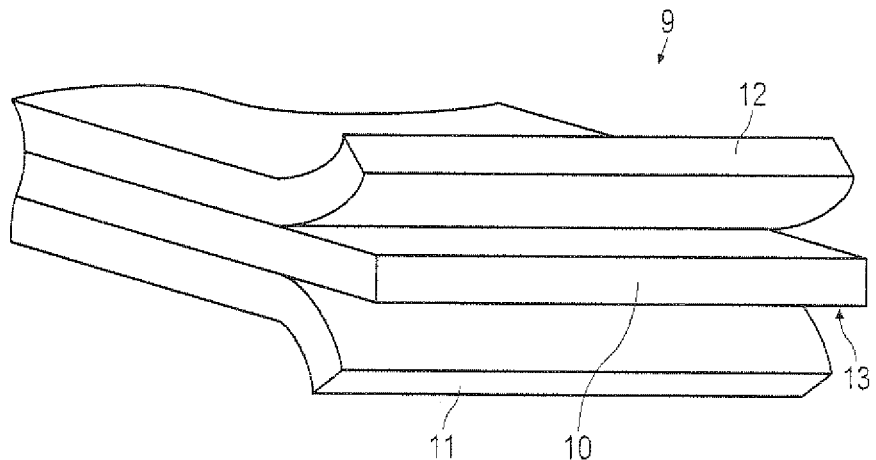
FIG. 2 illustrates a laminated film including a dry film resist.

In this embodiment, the film 1 may be a laminated film 9 including a dry film resist 10. The dry film resist 10 also may be called a dry film. The laminated film 9 is illustrated in FIG. 2 in accordance with at least some embodiments of the present disclosure. The dry film resist 10 may be sandwiched between a cover film 11 and a carrier film 12. The cover film 11 may be removed from the laminated film 9 prior to the application of the dry film resist 10 and the carrier film 12 to the rear side 4 of the semiconductor wafer 2 in order to expose a surface 13 of the dry film resist 10. The dry film resist 10 then may be placed in direct contact with the rear side 4 of the semiconductor wafer 2 and may be attached to the rear side 4 of the semiconductor wafer 2 by use of pressure and heat.

Figure 3:
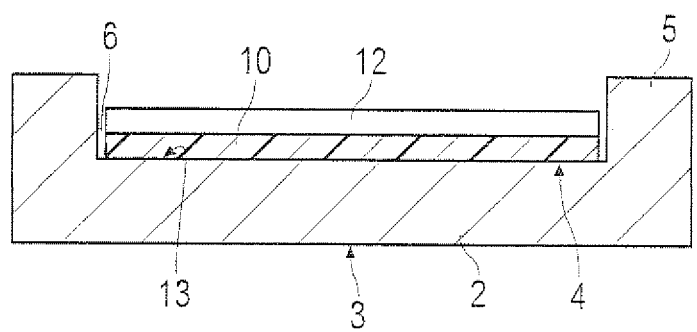
FIG. 3 illustrates a semiconductor wafer including a dry film resist layer.

The semiconductor wafer 2 with the dry film resist 10 and the carrier film 12 adhered to the rear side 4 is illustrated in FIG. 3 in accordance with at least some embodiments of the present disclosure. In this embodiment, the dry film resist 10 may be later removed entirely after it has served as a mask. Therefore, the semiconductor wafer 2 illustrated in FIG. 3 may be an intermediate product.

Figure 4:
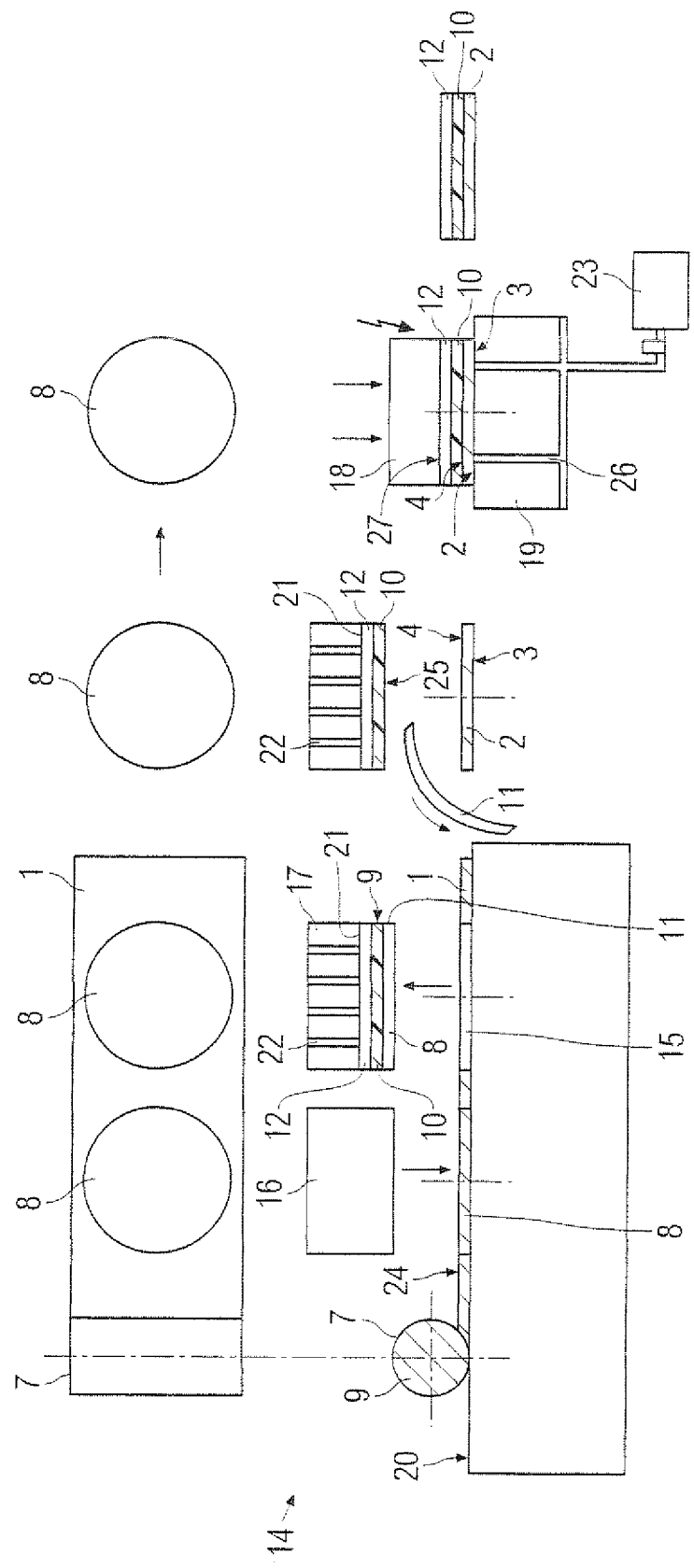
FIG. 4 illustrates an apparatus and a method of applying a dry film resist to a semiconductor wafer according to a second embodiment.

FIG. 4 illustrates an apparatus 14 for applying a film 1 to a semiconductor wafer 2 and a method of applying a film to a semiconductor wafer in accordance with at least some embodiments of the present disclosure. In the second embodiment, the film 2 also may be a laminated film 9 including a dry film resist 10 as illustrated in FIG. 2.

The apparatus 14 may include a chuck 15 for supporting the supply of film 1, a cutting device 16 for cutting pieces 8 out of the film 1, a vacuum chuck 17 for transferring the cut out pieces 8 from the film 1 to the wafer 2, a pressing tool 18 and a wafer support chuck 19.

The laminated film 9 may be supplied in the form of supply roll 7. A portion of the supply roll 7 may be pulled out from the supply roll 7 and may be positioned on the chuck 15 so that a cover film 11 of the film 9 is in contact with a top surface 20 of the chuck 15 and a carrier layer 12 of the film 9 faces upwards away from the chuck 15.

Circular pieces 8 having a diameter corresponding to the diameter of the semiconductor wafer 2 may be stamped out of the film 9 by stamping tool 16.

The vacuum chuck 17 may have a flat, uniform lifting surface 21 that also may be circular and that has a diameter corresponding to that of the piece 8, which has been stamped out of the supply film 9. The vacuum chuck 17 may include a plurality of through holes 22, which may be coupled to a vacuum supply 23. The vacuum chuck 17 may be aligned with the cutout circular piece 8 of the film 9 and the lifting surface 21 may be placed on a surface 24 of the carrier film 12. The vacuum then may be switched on so that the piece 8 may be sucked onto the lifting surface 21 of the vacuum chuck 17 and may be held on the vacuum chuck 17. The vacuum chuck 17 and piece 8 may be moved upwardly away from the film 1 and transversely to transfer the piece 8 from the film 1 to the semiconductor wafer 2.

The cover film 11 then may be removed from the piece 8 to reveal a surface 25 of the dry film resist 10.

The wafer 2 may be positioned on a wafer support chuck 19, which may include a plurality of through holes 26 that may be coupled to a vacuum device 23. A vacuum can be supplied to hold the wafer 2 on the surface of the wafer support chuck 19.

The vacuum chuck 17 then may be aligned with the wafer 2, lowered and the exposed lower surface 25 of the dry resist film 10 may be brought into contact with the rear side 4 of the semiconductor wafer 2. The vacuum supplied to the vacuum chuck 17 then may be switched off and gas may be fed into the through holes 22. When the pressure within the through holes 22 equals the ambient pressure, the piece 8 no longer remains attached to be lifting surface 21 of the vacuum chuck 17. The vacuum chuck 17 can then be removed whilst leaving the dry film resist 10 and the carrier film 12 of the piece 8 in contact with the rear side 4 of the wafer 2.

A pressing tool 18 also may be provided which may have a flat pressing surface 27, which may be circular and has a diameter corresponding to that of the piece 8 of the film 9 and semiconductor wafer 2. The pressing tool 18 may be aligned with the piece 8 and the semiconductor wafer 2 and may be lowered so that it exerts pressure on the dry film resist 10 and the wafer 2.

At the same time, heat may be applied to the semiconductor wafer 2 to attach the dry resist film 10 to the rear side 4 of the semiconductor wafer 2. The heat supply may be positioned in the wafer support chuck 19, in the pressing tool 18 or may be external to both. The dry film resist 10 then may be adhered to the rear side 4 of the semiconductor wafer 2 by the action of the heat and pressure. The pressing tool 18 then may be removed to leave the carrier film 12 and the dry resist film 10 may be attached to the rear side 4 of the semiconductor wafer 2.

In a generic sense, the dry resist film 10 can have a permanent resist or a temporary resist. The permanent resist may be intended to be part of a structure of the semiconductor wafer 2 and it may not be entirely removed from the semiconductor wafer 2. In comparison, the temporary resist may be intended for removing entirely from the semiconductor wafer 2 and it may not form a part of semiconductor wafer 2.

Figure 5:
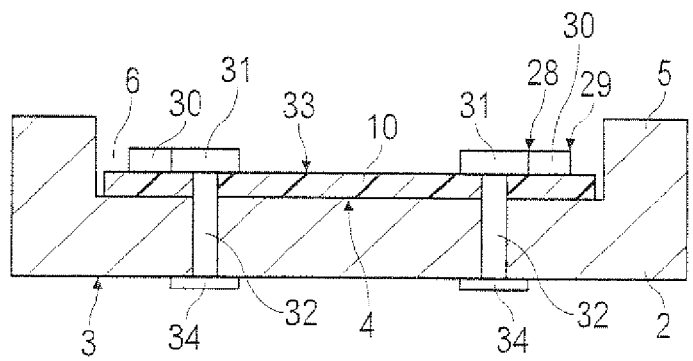
FIG. 5 illustrates a cross-sectional view of the finished semiconductor wafer 2 of FIG. 1.

FIG. 5 illustrates a cross-sectional view of a semiconductor wafer 2 according to a second embodiment in accordance with at least some embodiments of the present disclosure.

The semiconductor wafer 2 may have an integral supporting peripheral rim 5 in the form of a ring protruding from the rear side 4 of the semiconductor wafer 2 as in the embodiment illustrated in FIG. 2. In the second embodiment, the carrier film 12 may be removed so that only the dry film resist 10 remains on the semiconductor wafer 2. The dry film resist 10 may provide a portion of a redistribution structure 28 positioned on the rear side 4 of the semiconductor wafer 2.

The redistribution structure 28 may include a patterned electrically conductive redistribution layer 29 including contact pads 30 and redistribution traces 31 that may be positioned on the layer of dry film resist 10 that may include a polyimide. The dry film resist 10 may provide a dielectric layer of the redistribution structure 28 and may electrically isolate the redistribution layer 29 from the semiconductor wafer 2.

The semiconductor wafer 2 may include a plurality of vias 32, which may extend from the front side 3 to the rear side 4 of semiconductor wafer 2 within the central recessed portion 6. Only two vias are illustrated in FIG. 5 for clarity. The two vias are also not drawn to scale. In practice, each of the semiconductor chip positions within the wafer may include a plurality of vias.

The dry film resist 10 may be positioned directly on the rear side 4 semiconductor wafer and may be structured to extend the plurality of vias to the upper surface 33 of the dry film resist 10. A plurality of pads 34 may be positioned on the front side 3 of the semiconductor wafer 2. The vias 32 may include a layer of electrically conductive material on the sidewalls so as to electrically connect the pads 34 on the front side 3 of the semiconductor wafer with the redistribution traces 31 and contact pads 30 on the rear side 4 of the semiconductor wafer 2. In this embodiment, the dry film resist 9 may provide a permanent part of the redistribution structure of the semiconductor wafer 2.

Figure 6:
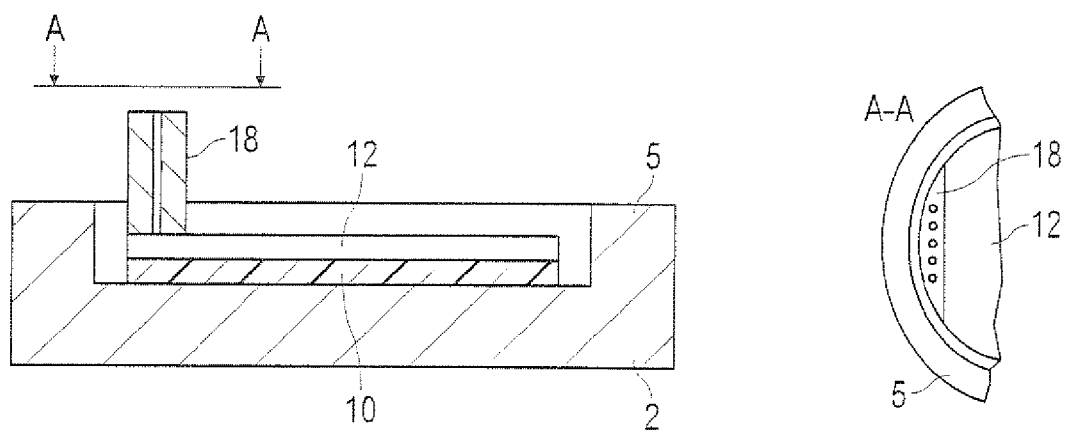
FIG. 6 illustrates the semiconductor wafer of FIG. 3 with a removal tool at a stage of a process for removing a carrier film of the dry film.
Figure 7:
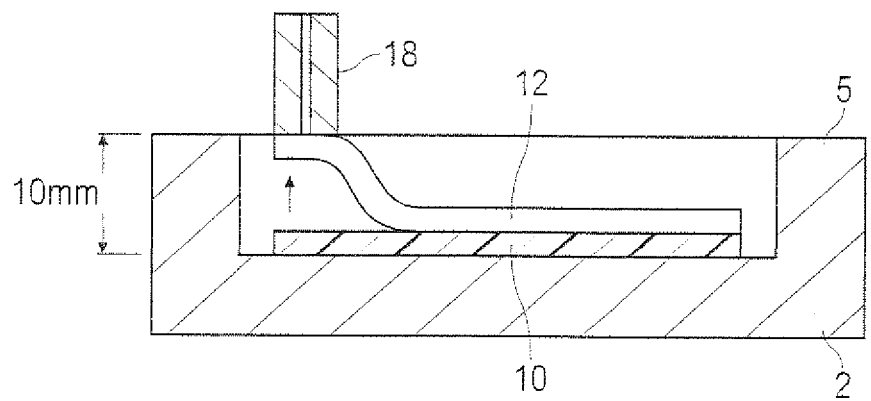
FIG. 7 illustrates a first operation of removing a carrier film of the dry film at a stage of a process for removing a carrier film of the dry film.
Figure 8:
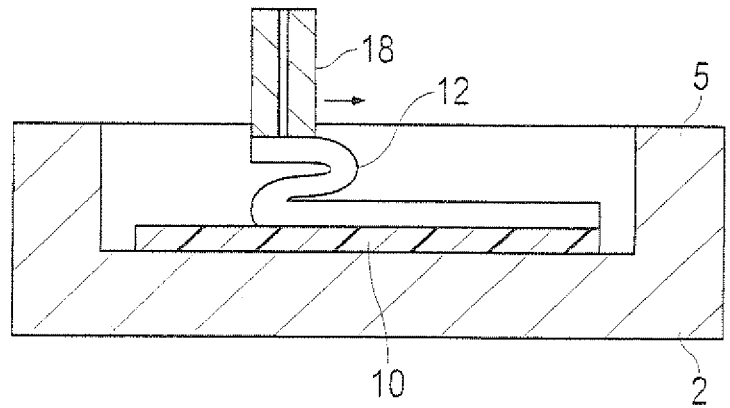
FIG. 8 illustrates a second operation of removing a carrier film of the dry film at a stage of a process for removing a carrier film of the dry film.

FIGS. 6 to 8 illustrate a tool for removing a carrier film of the dry film in accordance with at least some embodiments of the present disclosure.

FIG. 6 illustrates a pressing tool 18 that is positioned on an outer edge of the wafer 2 of FIG. 3 in accordance with at least some embodiments of the present disclosure. The pressing tool 18 may include a suction device that may touch an outer edge of the carrier film 12. The pressing tool 18 may act as a removal tool. The suction device may be intended for adhering to the carrier film 12 by way of a vacuum.

A method to remove the carrier film 12 may include the pressing tool 18 touching and adhering to the outer edge of the carrier film 12 by the vacuum. The pressing tool 18 may later move slowly upwards by circa ten mm (millimeters) to separate the outer edge from the wafer, for example, as illustrated in FIG. 7 in accordance with at least some embodiments of the present disclosure. The removal tool then may move sideway and may peel off the carrier film, as illustrated in FIG. 8 in accordance with at least some embodiments of the present disclosure. In this manner, only shear force may be applied onto the wafer. The removal process may be smooth and little or no damage may be done to the resist.

In a generic sense, the removal tool can be integrated into the pressing tool or the removal tool can exist as a separate tool. A similar tool can be used for the removal of the cover film.

An embodiment of a bumping process and an embodiment of a redistribution layer process are described below. The embodiments use dry film resist only without the need for spinning. The dry film resist can be a temporary resist or a permanent resist.

The first few operations of the bumping process and the redistribution layer process are similar. The similar operations are shown in one embodiment only for brevity.

FIGS. 9 to 16 illustrate operations of a bumping process. The bumping process may include two lithography operations, one permanent dry film resist operation, and one temporary dry film resist operation.

Figure 9:
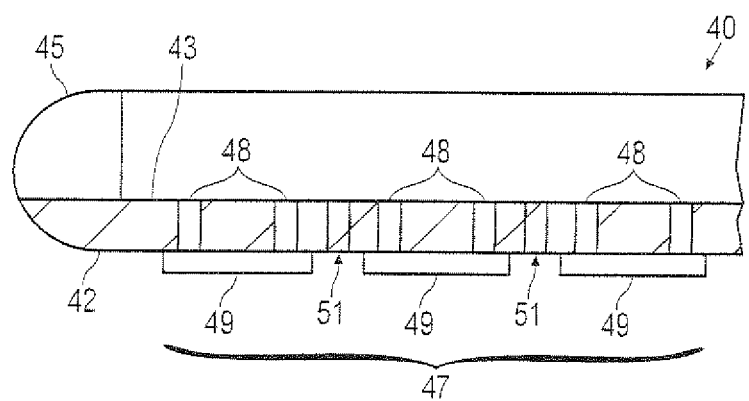
FIG. 9 illustrates a semiconductor wafer at a stage of a bumping process.

FIG. 9 shows a semiconductor wafer 40 that may have a first surface 42 and a second surface 43 that is opposite to the first surface in accordance with at least some embodiments of the present disclosure. The first surface 42 also may be called a front surface whilst the second surface may be called a rear surface.

A supporting peripheral rim 45 may protrude from the second surface 43. A central portion 47 of the first surface 42 may include a plurality of vias 48 and a plurality of active areas 49 that may be connected electrically to the plurality of vias 48.

For completeness, FIG. 9 also illustrates the central portion 47 with dicing lines 51 that may be positioned next to the active areas 49. The dicing lines 51 may indicate positions of dicing for a later operation of separating the semiconductor wafer 40 into multiple parts or semiconductor chips.

Figure 10:
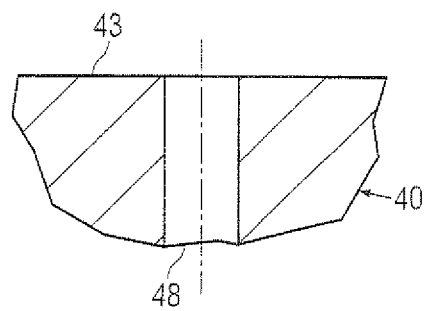
FIG. 10 illustrates a via of the semiconductor wafer of FIG. 9 at a stage of a bumping process.

The supporting peripheral rim 45 may have slits or channels. The vias 48 extend from the first surface 42 of the central portion 47 and extend toward the second surface 43 of the central portion 47. The vias 48 may be filled with a copper material. In comparison, the semiconductor wafer 40 may include silicon material. For clarity, FIG. 10 illustrates just one via 48 of the semiconductor wafer 40 of FIG. 9 in accordance with at least some embodiments of the present disclosure.

In practice, the supporting peripheral rim 45 may provide rigidity for the semiconductor wafer 40. In particular, the supporting peripheral rim 45 may provide mechanical support for the central portion 47. The slits of the supporting peripheral rim 45 may act to release any fluid, such as wet resist, in the central portion 47 of the semiconductor wafer 40 away from the semiconductor wafer 40. However, wet resist may not be used in the embodiments below.

The active areas 49 refer to electrical circuitries that may be formed in the semiconductor wafer 40. The vias 48 may act as electrical channels to connect the electrical circuitries to electrical terminals or contact pads. The dicing lines 51 may be intended for physically and electrically partitioning the active areas 49. The partitioned active areas 49 can later form part of multiple semiconductor chips.

A method for providing solder bumps for the semiconductor wafer 40 may include the operation of thinning the second surface 43 such that the vias 48 may be revealed or can be seen at the second surface 43, as illustrated in FIG. 9.

Figure 11:
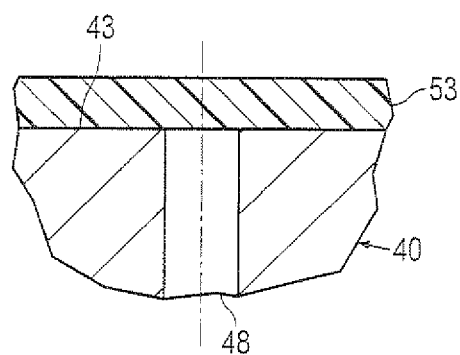
FIG. 11 illustrates the via FIG. 10 with a first dry film at a stage of a bumping process.

A permanent first dry film 53 then may be placed next to the second surface 43 of the semiconductor wafer 40, as illustrated in FIG. 11 in accordance with at least some embodiments of the present disclosure. The first dry film 53 may have a thickness of about one to five micrometers and the first dry film 53 may include polyimide material for providing a permanent resist, for example. The resist may be permanent in that it forms a part of a structure of the semiconductor wafer 40 and that it is not removed later from the semiconductor wafer 40. For clarity, the first dry film 53 is shown in FIG. 11 without a carrier film.

Figure 12:
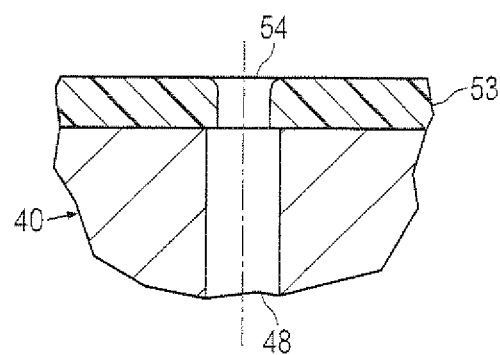
FIG. 12 illustrates the dry film of FIG. 11 with a via opening at a stage of a bumping process.

The first dry film 53 later may be photo-structured such that a circular space or opening 54 may be formed on the first dry film 53, as illustrated in FIG. 12 in accordance with at least some embodiments of the present disclosure. The term photo-structured is also known as photostructured and it may include the operations of aligning, exposing, and developing. In practice, the photo-structured generally does not produce sharp feature or contour or produce little sharp feature or contour.

The opening 54 may be positioned next to the via 48. The opening 54 may have a diameter that is smaller than a diameter of the via 48 to avoid developing electrical shorts.

Figure 13:
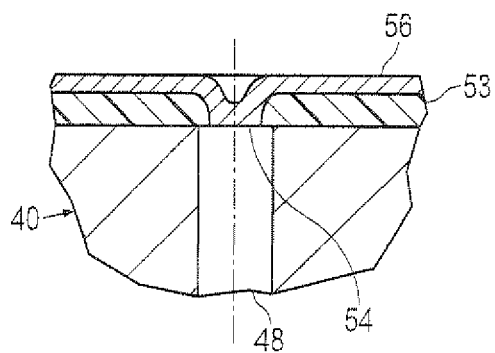
FIG. 13 illustrates a barrier and seed layer that are placed on the first dry film of FIG. 12 at a stage of a bumping process.

After this, a barrier and seed layer 56 may be sputtered or may be formed over the first dry film 53 and over the via 48 through the opening 54, as illustrated in FIG. 13 in accordance with at least some embodiments of the present disclosure. The barrier and seed layer 56 may have a thickness of less than one micrometer and it includes a diffusion barrier layer and a thin seed layer, for example. The diffusion barrier may include Titanium (Ti) material and it may act to prevent any diffusion of bump material into a material of via 48. The thin seed layer may include copper (Cu) material and it may acts for later easier provision of another layer of material.

Figure 14:
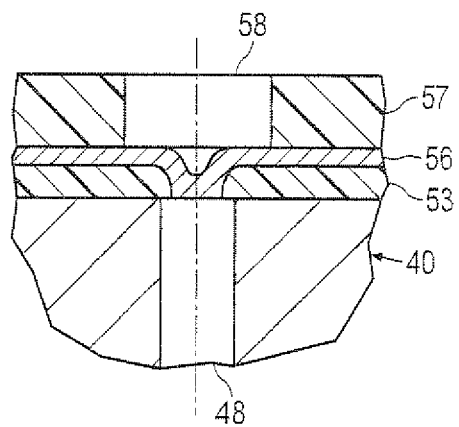
FIG. 14 illustrates a second dry film that is placed on the barrier and seed layer seed layer of FIG. 13 at a stage of a bumping process.

A temporary thick second dry film 57 then may be placed next to the barrier and seed layer 56, as illustrated in FIG. 14 in accordance with at least some embodiments of the present disclosure. The dry film 57 may have a high thickness of about fifty micrometers, for example. The second dry film 57 may include a type of resist that can be removed in a later operation. The thick second dry film 57 also may have a certain stiffness that allows it go over uneven features of the barrier and seed layer 56.

The thick dry film 57 later may be photo-structured with an opening 58, as illustrated in FIG. 14. The opening 58 may have a diameter that is larger than the diameter of the via 48 and it may be positioned next the via 48. The opening 58 may act as a template for a solder bump.

Figure 15:
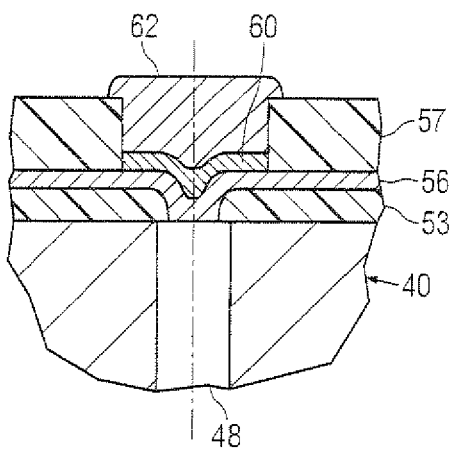
FIG. 15 illustrates the second dry film of FIG. 14 with a solder bump at a stage of a bumping process.

A nickel layer 60 may be deposited afterward in the opening 58, as illustrated in FIG. 15 in accordance with at least some embodiments of the present disclosure. The nickel layer 60 may act as a barrier layer to an alloy of a solder bump.

A solder bump 62 then may be deposited by electrochemical procedure on the nickel layer 60, as illustrated in FIG. 15. The solder bump 62 may have a thickness of more than about fifty micrometers, for example. The solder bump 62 can include tin (Sn) and silver (Ag), or lead (Pb) and silver (Sn) material, for example.

Figure 16:
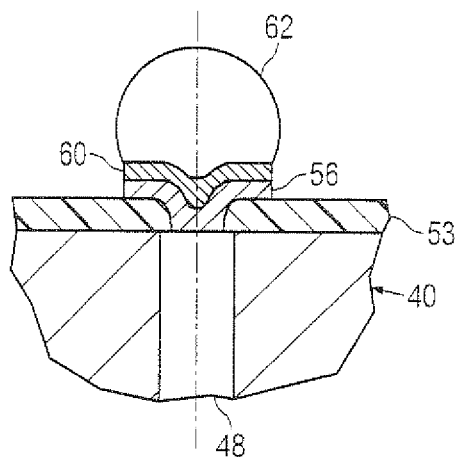
FIG. 16 illustrates the solder bump of FIG. 15 after a reflow at a stage of a bumping process.

The thick dry film 57 may be removed afterward, as illustrated in FIG. 16 in accordance with at least some embodiments of the present disclosure. The exposed barrier and seed layer 56 then may be etched, as illustrated in FIG. 16.

After this, the solder bump 62 may be subjected to a solder reflow process by a reflow oven or by a hot air. The solder reflow may provide controlled heating to the solder bump 62. This may melt the solder bump 62 and may join the solder bump 62 to the nickel layer 60. FIG. 16 illustrates the solder bump 62 after the reflow in accordance with at least some embodiments of the present disclosure.

FIGS. 17 to 25 illustrate operations of a redistribution layer process in accordance with at least some embodiments of the present disclosure. The redistribution layer process may include four lithography operations, two temporary dry film resist operations, and two permanent dry film resist operations.

Figure 17:
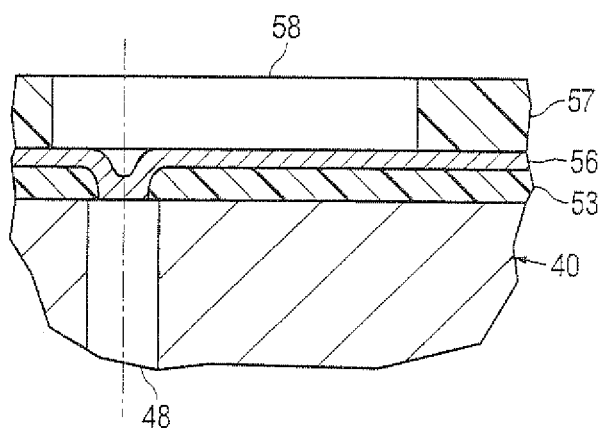
FIG. 17 illustrates the first barrier layer and seed layer of FIG. 13 with a second dry film that has a via opening at a stage of a redistribution layer process.

The redistribution layer process may include an operation of placing the temporary second dry film 57 over the barrier and seed layer 56 of FIG. 13, as illustrated in FIG. 17 in accordance with at least some embodiments of the present disclosure. The second dry film 57 may have a thickness of between about one to about five micrometers and the dry film 57 has the opening 58, for example.

Figure 18:
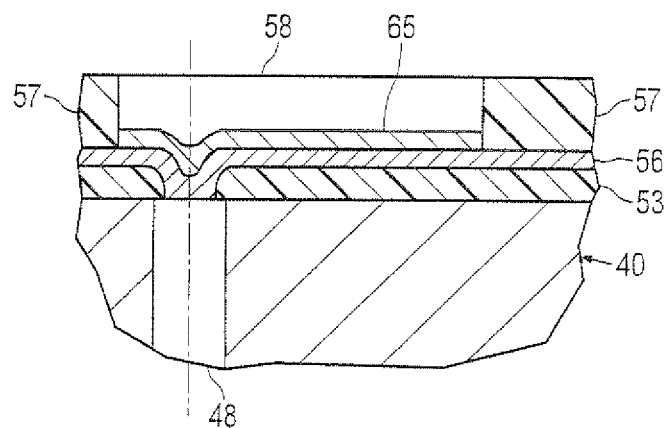
FIG. 18 illustrates the second dry film of the FIG. 17 at a stage of a redistribution layer process, wherein a via opening of the second dry film is filled with a layer of copper.
Figure 19:
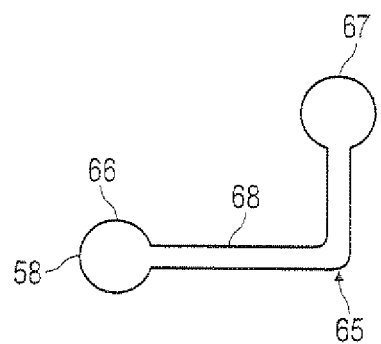
FIG. 19 illustrates a top view of FIG. 18 at a stage of a redistribution layer process.

A copper layer 65 then may be deposited in the opening 58 and over the barrier and seed layer 56, as illustrated in FIG. 18 in accordance with at least some embodiments of the present disclosure. The copper layer 65 may have a thickness of a few micrometers. The copper layer 65 may provide electrical connections. Just one connection is illustrated in FIG. 19 for clarity. FIG. 19 illustrates a top view of a layout of the copper layer 65 in accordance with at least some embodiments of the present disclosure. The copper layer 65 may include a via-contact area 66, a bump landing area 67, and a conductive track 68 that connects electrically the bump landing area 67 to the via-contact area 66. The via-contact area 66 may fill the opening 58 and it acts to connect electrically the copper layer 65 to a bump landing area 67 offset from via 48.

Figure 20:
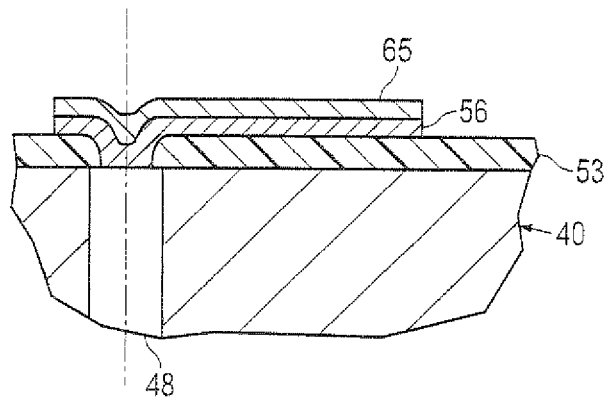
FIG. 20 illustrates a side view of FIG. 18 after the second dry film layer is removed at a stage of a redistribution layer process.

After this, the temporary second dry film 57 may be stripped away or may be removed and the exposed barrier and seed layer 56 may be etched, as illustrated in FIG. 20 in accordance with at least some embodiments of the present disclosure.

Figure 21:
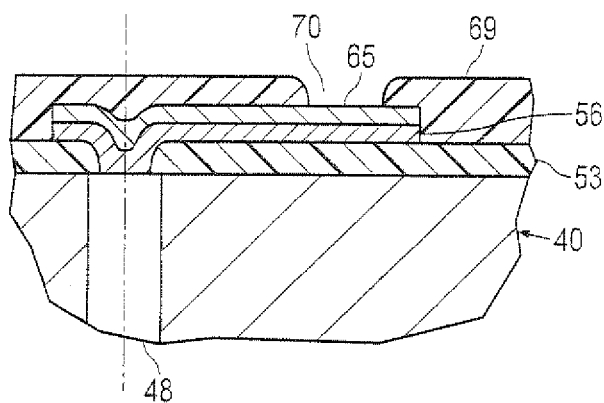
FIG. 21 illustrates the first barrier and seed layer of FIG. 20 with a third dry film that has a first bump opening at a stage of a redistribution layer process.

A permanent third dry film 69 for forming landing pads for solder bump then may be placed over the barrier and seed layer 56, as illustrated in FIG. 21 in accordance with at least some embodiments of the present disclosure. The third dry film 69 may have a thickness of about a few micrometers. The dry film 69 later may be photo-structured to form an opening 70 in the dry film 69. The third dry film 69 may include polyimide material for providing a permanent resist, for example.

Figure 22:
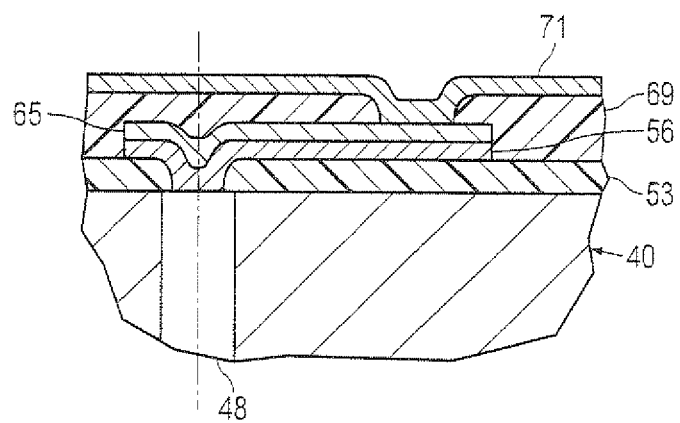
FIG. 22 illustrates the third dry film of FIG. 21 with a second barrier and seed layer at a stage of a redistribution layer process.

A second barrier and seed layer 71 later may be sputtered over the third dry film 69, as illustrated in FIG. 22 in accordance with at least some embodiments of the present disclosure. The second barrier and seed layer 71 may have a thickness of less than one micrometer, for example.

Figure 23:
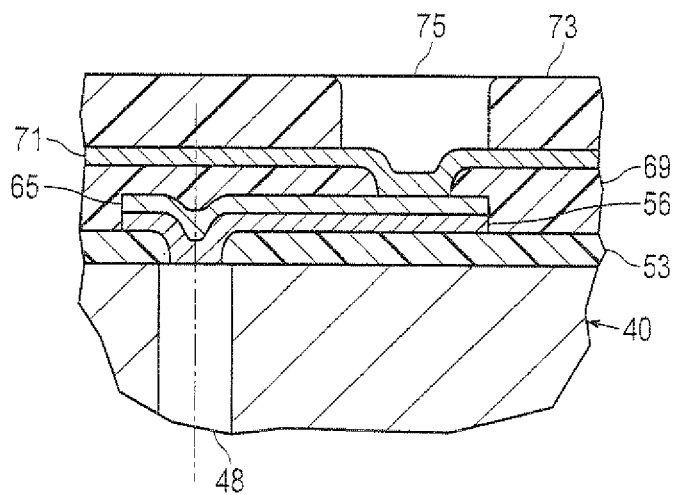
FIG. 23 illustrates the second barrier and seed layer of FIG. 22 with a fourth dry film that has a second bump opening at a stage of a redistribution layer process.

After this, a temporary thick fourth dry film 73 may be provided over the second barrier and seed layer 71, as illustrated in FIG. 23 in accordance with at least some embodiments of the present disclosure. The fourth dry film 73 may have a high thickness of more than about fifty micrometers, for example. The fourth dry film 73 may be photo-structured to provide an opening 75. The fourth dry film 73 may act as a template for a solder bump. Depending on design rules, a diameter of the opening 75 can be smaller, larger, or equal to the polyimide opening 54 of the dry film 53 of FIG. 12.

Figure 24:
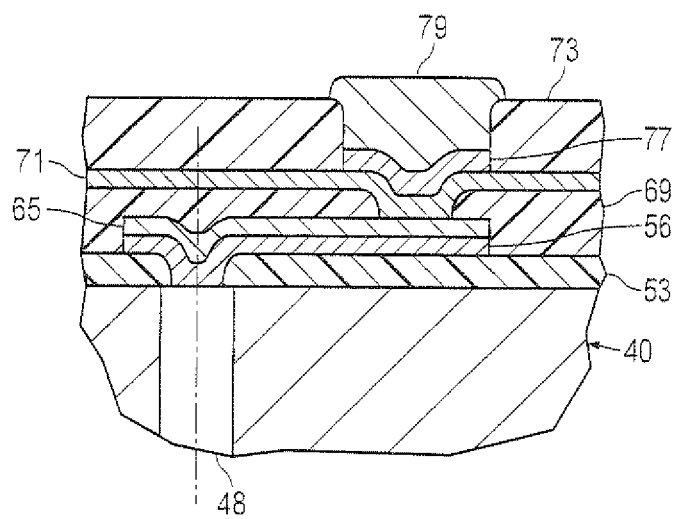
FIG. 24 illustrates the bump opening of FIG. 23 with a solder bump at a stage of a redistribution layer process.

A nickel layer 77 then may be deposited over a portion of the second barrier and seed layer 71 that may be within the opening 75 via an electrochemical deposition procedure, as illustrated in FIG. 24 in accordance with at least some embodiments of the present disclosure. The nickel layer 77 may have a thickness of about a few micrometers.

Similarly, a solder bump 79 later may be deposited over the nickel layer 77 that is within the opening 75, as illustrated in FIG. 24. Solder bump 79 may be positioned on dry film resist 69 so as to be positioned over bump landing area 67 and offset from via 48. The solder bump 79 may have a thickness of more than about fifty micrometers, for example. The nickel layer 77 may act as a barrier layer for the solder bump 79. The solder bump 79 can include tin (Sn) and silver (Ag), or lead (Pb) and silver (Sn) material, for example.

Figure 25:
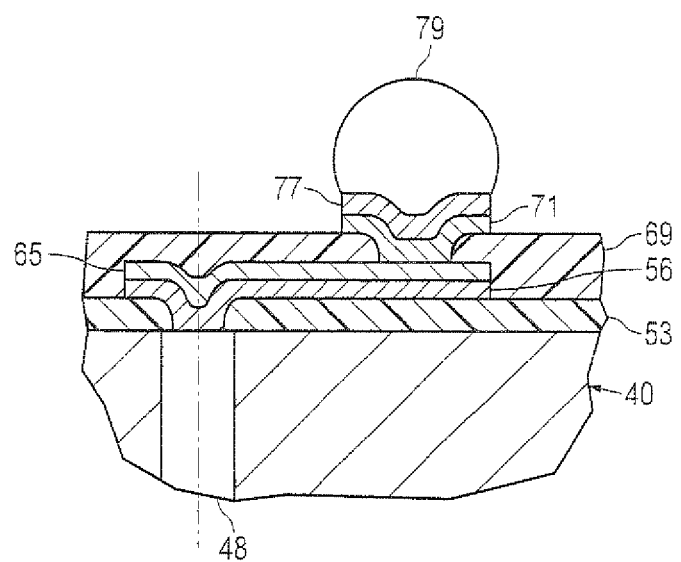
FIG. 25 illustrates the solder bump of FIG. 24 after a solder reflow at a stage of a redistribution layer process.

Later, the fourth dry film 73 may be stripped away or may be removed, as illustrated in FIG. 25 in accordance with at least some embodiments of the present disclosure. The nickel layer 77 and the second barrier and seed layer 71 then may be etched. After this, the solder bump 79 may be subjected to reflow. The solder bump 79 after the reflow is illustrated in FIG. 25.

Figure 26:
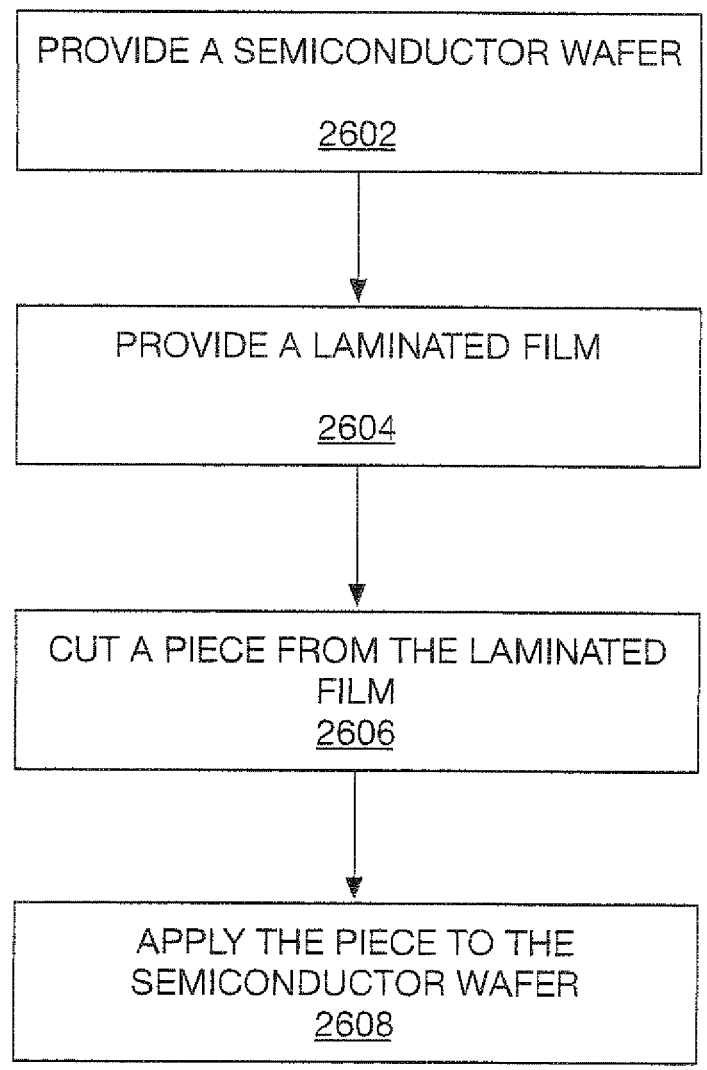
FIG. 26 illustrates an example process for semiconductor processing.

Some of the reference numbers from FIGS. 1-25 are listed below for reference:

1 film
2 semiconductor wafer
3 front side
4 rear side
5 rim
6 central recessed portion
7 roll
8 piece
9 laminated film
10 dry film resist
11 cover film
12 carrier film
13 surface
14 apparatus
15 chuck
16 cutting device
17 vacuum chuck
18 pressing tool
19 support chuck
20 surface
21 uniform lifting surface
22 hole
23 vacuum supply
24 surface
25 surface
26 hole
27 surface
28 redistribution structure
29 redistribution layer
30 contact pad
31 redistribution trace
32 via
33 surface
34 pad
40 semiconductor wafer
42 first surface
43 second surface
45 supporting peripheral rim
47 central portion
48 via
49 active area
51 dicing line
53 dry film
54 opening
56 barrier and seed layer
57 dry film
58 opening
60 layer
62 bump
65 copper layer
66 via-contact area
67 bump landing area
68 conductive track
69 dry film
70 opening
71 second barrier and seed layer 73 fourth dry film
75 opening
77 nickel layer
79 solder bump FIG. 26 illustrates an example process 2600 for semiconductor processing in accordance with at least some embodiments of the present disclosure. Process 2600, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 26 may be practiced in various implementations. For example, although process 2600, as shown in FIG. 26, comprises one particular order of blocks or actions, the order in which these blocks or actions are presented does not necessarily limit claimed subject matter to any particular order. Likewise, intervening actions not shown in FIG. 26 and/or additional actions not shown in FIG. 26 may be employed and/or some of the actions shown in FIG. 26 may be eliminated, without departing from the scope of claimed subject matter. An example process may include one or more of blocks 2602, 2604, 2606, and/or 2608.

As illustrated, process 2600 may be implemented for applying a film to a semiconductor wafer as a portion of semiconductor processing. Processing may begin at block 2602, "provide a semiconductor wafer", where a semiconductor wafer may be provided. Processing may continue from block 2602 to block 2604, "provide a laminated film", where a laminated film may be provided. For example, a laminated film may be provided including a dry film resist and a carrier film that is provided next to the dry film resist.

Processing may continue from block 2604 to block 2606, "cut a piece from the laminated film", where at least one piece may be cut out of the laminated film. For example, at least one piece may be cut out of the laminated film having a size and shape adapted to the semiconductor wafer. In some examples, the piece may be cut out of the laminated film by stamping. In some examples, the piece may be generally circular in shape. In some examples, the piece may have a diameter corresponding to a diameter of the semiconductor wafer. In some examples, the piece may be removed from the laminated film by use of a vacuum chuck.

In some examples, the semiconductor wafer may include a supporting peripheral rim that protrudes from a first side of the wafer. In such examples, the piece may be positioned on the first side of the semiconductor wafer within the supporting peripheral rim. Such a supporting peripheral rim may confine an area of the first side and the piece may have a form adapted to the area of the first side of the wafer confined by the peripheral rim. Such a supporting peripheral rim may include a plurality of perforations.

Processing may continue from block 2606 to block 2608, "apply the piece to the semiconductor wafer", where the piece may be applied to the semiconductor wafer. For example, the piece may be applied to the semiconductor wafer by pressing. Such pressing may be accompanied by applying heat whilst the piece is pressed onto the semiconductor wafer. In some examples, laminated film may include a cover film, which may be removed after the piece is removed from the laminated film and before the piece is applied to the semiconductor wafer.

In some examples, process 2600 may include operations to photo-structure the dry film resist, structure exposed portions of the semiconductor wafer, and/or remove the dry film resist. For example, the dry film resist may be photo-structured by operations including applying a mask to the carrier film, exposing the carrier film to UV radiation, removing the carrier film, developing the dry resist to remove unexposed portions of the dry film resist, and/or structuring to remove regions uncovered by the dry film resist. In such examples, the dry film resist may be further photo-structured by removing the carrier film prior to the exposing of the carrier film to UV radiation.

In some examples, process 2600 may include operations to apply a redistribution layer onto the dry film resist. For example, such operations to apply a redistribution layer are discussed in greater detail above, with regard to FIGS. 17-25.

Figure 27:
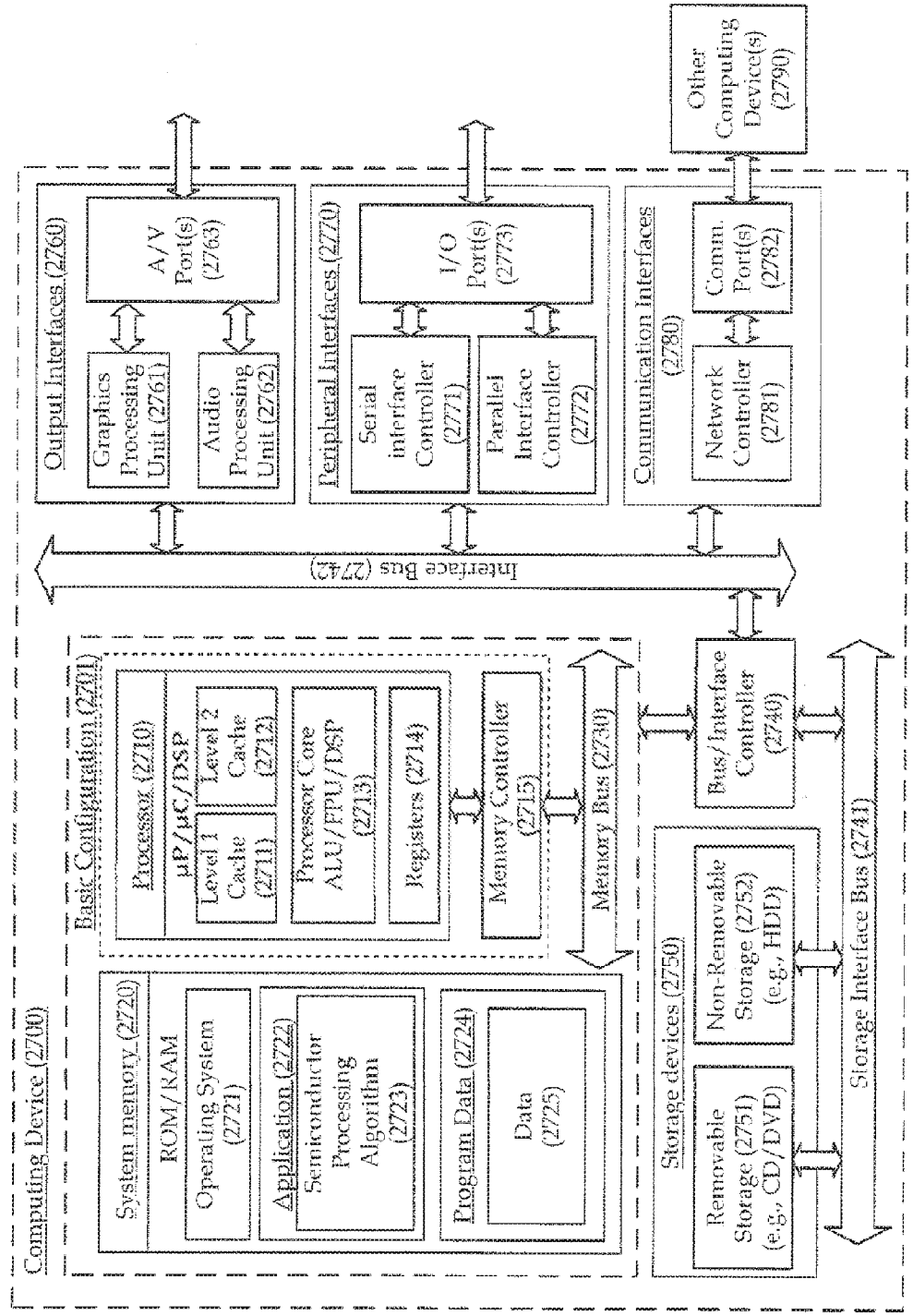
FIG. 27 is a block diagram of an illustrative embodiment of a computing device.

FIG. 27 is a block diagram of an illustrative embodiment of a computing device 2700 that is arranged to generate semiconductor devices, in accordance with the present disclosure. In one example basic configuration 2701, computing device 2700 may include one or more processors 2710 and a system memory 2720. A memory bus 2730 can be used for communicating between the processor 2710 and the system memory 2720.

Depending on the desired configuration, processor 2710 may be of any type including but not limited to a microprocessor (μP), a microcontroller (μC), a digital signal processor (DSP), or any combination thereof. Processor 2710 can include one or more levels of caching, such as a level one cache 2711 and a level two cache 2712, a processor core 2713, and registers 2714. Processor core 2713 can include an arithmetic logic unit (ALU), a floating point unit (FPU), a digital signal processing core (DSP Core), or any combination thereof. A memory controller 2715 can also be used with processor 2710, or in some implementations memory controller 2715 can be an internal part of processor 2710.

Depending on the desired configuration, system memory 2720 may be of any type including but not limited to volatile memory (such as RAM), non-volatile memory (such as ROM, flash memory, etc.) or any combination thereof. System memory 2720 may include an operating system 2721, one or more applications 2722, and program data 2724. Application 2722 may include a semiconductor processing algorithm 2723 that is arranged to perform the functions as described herein including the functional blocks and/or actions described with respect to process 2600 of FIG. 26, for example. Program Data 2724 may include data 2725 for use with processing algorithm 2723. In some example embodiments, application 2722 may be arranged to operate with program data 2724 on an operating system 2721 such that implementations of semiconductor fabrication may be provided as described herein. This described basic configuration is illustrated in FIG. 27 by those components within the dashed line enclosing basic configuration 2701.

Computing device 2700 may have additional features or functionality, and additional interfaces to facilitate communications between basic configuration 2701 and any required devices and interfaces. For example, a bus/interface controller 2740 may be used to facilitate communications between basic configuration 2701 and one or more data storage devices 2750 via a storage interface bus 2741. Data storage devices 2750 may be removable storage devices 2751, non-removable storage devices 2752, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 2720, removable storage 2751 and non-removable storage 2752 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 2700. Any such computer storage media may be part of device 2700.

Computing device 2700 may also include an interface bus 2742 for facilitating communication from various interface devices (e.g., output interfaces, peripheral interfaces, and communication interfaces) to basic configuration 2701 via bus/interface controller 2740. Example output interfaces 2760 may include a graphics processing unit 2761 and an audio processing unit 2762, which may be configured to communicate to various external devices such as a display or speakers via one or more A/V ports 2763. Example peripheral interfaces 2770 may include a serial interface controller 2771 or a parallel interface controller 2772, which may be configured to communicate with external devices such as input devices (e.g., keyboard, mouse, pen, voice input device, touch input device, etc.) or other peripheral devices (e.g., printer, scanner, etc.) via one or more I/O ports 2773. An example communication interface 2780 includes a network controller 2781, which may be arranged to facilitate communications with one or more other computing devices 2790 over a network communication via one or more communication ports 2782. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 2700 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 2700 may also be implemented as a personal computer including both laptop computer and non-laptop computer configurations. In addition, computing device 2700 may be implemented as part of a wireless base station or other wireless system or device.

Computing device 2700 may include a semiconductor chip or semiconductor device, such as devices incorporating the illustrated in FIG. 16 and/or FIG. 25. Such a devices incorporating the illustrated in FIG. 16 and/or FIG. 25 might incorporated in one or more components of computing device 2700, such as processor 2710, system memory 2720, and/or the like, and/or combinations thereof.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A semiconductor wafer that includes a plurality of vias, the semiconductor wafer comprising:
   a supporting peripheral rim that protrudes from a first side of the semiconductor wafer;
   a first dry film resist arranged on the first side of the semiconductor wafer within the supporting peripheral rim, wherein the first dry film resist is photo-structured to form a first opening on the first dry film resist so that a via of the plurality of vias remains revealed from the first dry film resist through the first opening, and wherein a diameter of the first opening is smaller than a diameter of the via revealed from the first dry film resist; and
   a removable second dry film resist arranged on the first dry film resist, wherein the removable second dry film resist is photo-structured to form a second opening on the removable second dry film resist and a diameter of the second opening is larger than the diameter of the via revealed from the first dry film resist.

2. The semiconductor wafer according to claim 1, wherein the first dry film resist has cut edges.

3. The semiconductor wafer according to claim 1, wherein at least a portion of the first dry film resist forms an integral part of a semiconductor chip.

4. The semiconductor wafer according to claim 1, further comprising a bump positioned on the first dry film resist, the bump being positioned over a bump landing area that is offset from the via.

5. The semiconductor wafer according to claim 1, further comprising a bump positioned on the first dry film resist and positioned over the via.

6. The semiconductor wafer according to claim 1, wherein the supporting peripheral rim comprises a plurality of perforations.

7. The semiconductor wafer according to claim 6, wherein the plurality of perforations extend from an inner side wall to an outer side wall of the supporting peripheral rim.

8. The semiconductor wafer according to claim 1, wherein the first dry film resist includes a plurality of openings corresponding to the plurality of vias and each diameter of the plurality of openings is smaller than each diameter of the plurality of vias.

9. The semiconductor wafer according to claim 1, wherein the first dry film resist is a permanent resist.

10. The semiconductor wafer according to claim 1, further comprising a bump deposited in the second opening.

11. The semiconductor wafer according to claim 1, wherein first dry film resist and the removable second dry film resist comprise different materials.

\* \* \* \* \*